United States Patent [19]
Ackley et al.

[11] Patent Number: 5,324,964
[45] Date of Patent: Jun. 28, 1994

[54] SUPERLUMINESCENT SURFACE LIGHT EMITTING DEVICE

[75] Inventors: Donald E. Ackley, Paradise Valley; Michael S. Lebby, Chandler, both of Ariz.

[73] Assignee: Motorola, Inc., Schaumburg, Ill.

[21] Appl. No.: 770,841

[22] Filed: Oct. 4, 1991

[51] Int. Cl.$^5$ .................. H01L 33/00; H01S 3/19
[52] U.S. Cl. .................. 257/98; 257/13; 372/45; 372/92; 372/99
[58] Field of Search .................. 257/13, 94, 96, 97, 257/98; 372/44, 45, 92, 99; 437/129

[56] References Cited

U.S. PATENT DOCUMENTS 5,052,008  9/1991  Kemeny ..................... 372/92

Primary Examiner—James W. Davie
Attorney, Agent, or Firm—Harry A. Wolin; Michael A. Waters

[57] ABSTRACT

A superluminescent surface light emitting device comprising a mirror layer (19) formed on a surface of a semiconductor substrate (22). Above the mirror (19) is a light emitting region (16). A second mirror (12) is located in a plane above the light emitting region (16). The combined reflectivities of the mirrors (19,12) are selected such that light is emitted in the superluminescent operating mode in a direction perpendicular to the surface of the device. An implanted region (14) may be used to improve superluminescent operation.

13 Claims, 1 Drawing Sheet

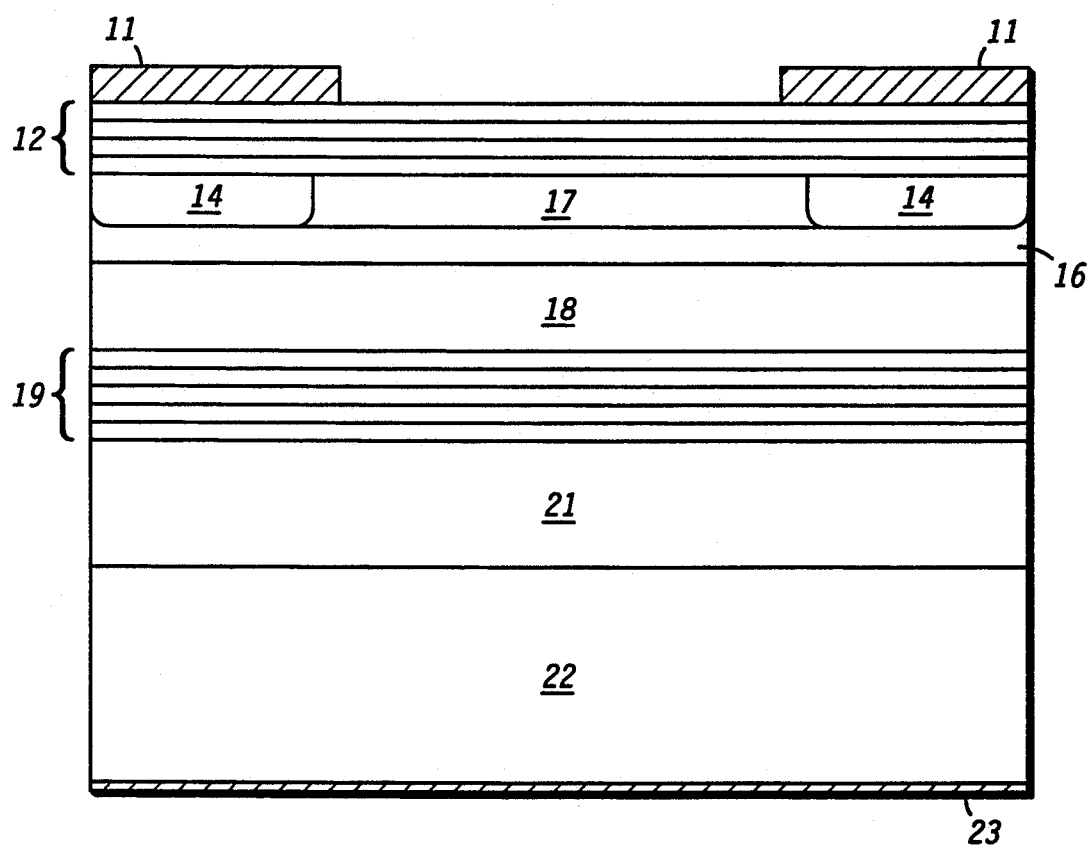

SUPERLUMINESCENT SURFACE LIGHT EMITTING DEVICE

BACKGROUND OF THE INVENTION

The present invention relates, in general, to manufacturing semiconductor devices, and more particularly to manufacturing of semiconductor devices which emit light.

This application is related to U.S. Pat. No. 5,034,092, entitled "Plasma Etching of Semiconductor Substrates", by M. Lebby et al., assigned to Motorola Inc., which is incorporated herein by reference. M. Lebby is co-inventor of the present invention which is also assigned to Motorola Inc.. The related patent teaches a fabrication method used in a structure which is superficially similar to that of the present invention. The earlier device, however, was fabricated as a vertical cavity surface emitting laser (VCSEL) rather than a superluminescent surface light emitting device.

Superluminescent light-emitting devices combine high efficiency with a broad spectral bandwidth. These characteristics are important for achieving high performance in applications such as a light source for fiber-optic gyroscopes. Another application for such devices is in a display matrix in which light from several hundred devices is combined to form an image. Light emitting diodes have low efficiency, but light from lasers combines to produce an undesirable "speckle" effect in an image due to coherent wave interference. The broad spectral bandwidth of a superluminescent light-emitting device precludes coherent wave interference effects.

Production of light through the surface of a semiconductor device is highly desirable. Such devices have the potential to be incorporated within an integrated circuit chip having other functions. Also, large arrays of similar such devices may be fabricated on a single substrate to provide an economical, high efficiency, planar display. A surface emitting device may be assembled easily by direct mounting onto a substrate rather than requiring a difficult "flip" mounting. Testing of the device before separation of the wafer into individual chips is possible. This pre-separation testing avoids the need to mount and package defective devices which must then be scrapped. Since packaging costs are a major component of the total device cost both the ease of assembly and pre-separation testing represent significant manufacturing cost reductions. Studies of defect locations on a wafer often provides valuable information which may be used to optimize a wafer manufacturing process. This valuable manufacturing information cannot be obtained if the wafer must be separated into chips before testing. Finally, the finished device will exhibit improved reliability since the critical junction regions are sealed within the structure.

Superluminescent devices provide high efficiency and freedom from wave interference effects, surface light emitting devices facilitate economical manufacturing, testing and packaging. There is a need for a device which combines the advantages of surface light emission with the unique advantages of superluminescence.

SUMMARY OF THE INVENTION

Briefly stated, the present invention provides a superluminescent surface light emitting device. This device comprises a mirror layer formed on a surface of a semiconductor substrate. A light emitting region, formed in a plane above the mirror, which includes at least one active layer which emits light when impressed with a bias current. A second mirror located in a plane above the light emitting region wherein the combined reflectivities of the first and second reflector are selected such that light is emitted in the superluminescent operating mode in a direction perpendicular to the surface of the device.

BRIEF DESCRIPTION OF THE DRAWING

A single drawing shows a cross sectional view of a superluminescent surface light emitting device according to the present invention.

DETAILED DESCRIPTION OF THE DRAWING

The single drawing illustrates a simplified enlarged cross-section view of a superluminescent surface light emitting device (SUPERSLED) in accordance with the present invention. A semiconductor substrate 22 fabricated of n type GaAs material serves to provide an overall support for the device. The layers which comprise the SUPERSLED are deposited or grown in ways well known in the art on the top surface of semiconductor substrate 22. A buffer layer 21, typically 1000Å of GaAs or AlGaAs, serves to smooth the top surface of semiconductor substrate 22. A lower reflector 19 is formed on top of buffer layer 21 which in turn is positioned above semiconductor substrate 22. Lower reflector 19 comprises a structure known as a superlattice in which a plurality of alternating layers of AlAs and AlGaAs are formed with matching crystal structures. Each layer comprising lower reflector 19 is formed having a thickness of approximately one quarter wavelength ($0.25\lambda$) of the light output in the semiconductor material. A bottom spacer 18, comprising approximately 1000Å of AlGaAs is epitaxially grown on top of lower reflector 19. Bottom spacer 18 provides a region having a wide bandgap which serves to confine holes and electrons within an active layer 16. Active layer 16, positioned over bottom spacer 18, comprises a plurality of quantum wells, that is to say a plurality of light emitting regions, each approximately 100Å thick. The plurality of light emitting regions are fabricated in a plane which is parallel to and above lower reflector 19 and is separated from lower reflector 19 by bottom spacer 18. The light emitting regions which comprise active layer 16 serve to emit light when a bias current is applied to them. Above active layer 16 is formed a top spacer 17. Top spacer 17 is similar in structure and function to bottom spacer 18. The total thickness of active layer 16, bottom spacer 18 and top spacer 17 must equal a multiple of one half wavelength ($0.5\lambda$) at the emission wavelength in the semiconductor to maintain a proper phase relationship between the mirrors.

An oxygen implant 14 is typically implanted within portions of top spacer 17 to reduce reflections from the edges of the SUPERSLED. Reduction of such reflections serves as a means for suppressing undesired superluminescence which is parallel to the surface. Oxygen implant 14 also serves to confine the applied bias current to a predetermined region in the horizontal direction. This effect further reduces generation of light in a horizontal direction. An output reflector 12 is formed above top spacer 17, in a plane above active layer 16. Output reflector 12 is typically similar in structure to lower reflector 19, except that the number of layers is fewer. Having fewer layers reduces the reflectivity of output reflector 12 and allows light to be emitted from the surface. The reflectivities of lower reflector 19 and output reflector 12 are selected such that light is emitted in the superluminescent operating mode in a direction perpendicular to the surface of the device. A top contact 11 and a bottom contact 23, comprising a metal such as a gold alloy, is deposited on the top and bottom of the structure. Top contact 11 and bottom contact 23 serve as a contact means whereby a bias current may be applied to the SUPERSLED and thus applied to active layer 16.

This structure is superficially similar to that used for the VCSEL which was described in the related U.S. Pat. No. 5,032,092 cited above. In the laser device described by the cited patent the reflectivities of the upper and lower mirror stacks are chosen to be nearly 100% so as to achieve lasing in the vertical direction. By contrast, in a superluminescent device the reflectivity is chosen to be somewhat less than 100% because lasing is undesirable. However, reflectors are still needed to enhance superluminescent behavior in the vertical direction by increasing the number of passes a photon makes through the active layer (gain region). The modal threshold gain for lasing in a surface emitter is given in an article entitled "InGaAs Vertical-Cavity Surface-Emitting Lasers", by R. S. Geals et al, IEEE J. Quantum Electron 27, 1359 (1991) which is incorporated herein by reference. The modal threshold gain may be approximated as:

$$g_{th} = \frac{L_{eff}}{\Gamma L_g} \beta_{fc} + \frac{1}{2\Gamma L_g} \ln\left(\frac{1}{R_f R_b}\right).$$

Where: $g_{th}$ is the lasing threshold gain, $\beta_{fc}$ is the nominal absorption loss (including free carrier losses), and the term $$\frac{1}{2\Gamma L_g} \ln\left(\frac{1}{R_f R_b}\right)$$

represents the end losses in the cavity. Since the gain medium does not fill the entire cavity, the length $L_g$ is the length of the gain medium, $L_{eff}$ is the penetration of the optical field into the mirrors. $\rho$ is the overlap of the optical field with the gain region. $R_f$ is the reflectivity of output reflector 12, and $R_b$ is the reflectivity of lower reflector 19.

Embodiments of the present invention adjust the combined reflectivities of lower reflector 19 and output reflector 12 by adding or subtracting quarter wavelength layers within those respective structures. In the preferred embodiment, the lasing threshold gain ($g_{th}$) is selected by adjustment of the reflectivities of lower reflector 19 ($R_b$) and output reflector 12 ($R_f$). The lasing threshold gain ($g_{th}$) is also selected by varying the thickness of the gain region ($L_g$), typically by varying the number of quantum wells in active layer 16. For superluminescent operation, the operating gain (g) provided by current injection must be in the range $g > 0$ and $g < g_{th}$. To optimize the superluminescent operation in the vertical direction, the reflectivities must be chosen large enough so that the lifetime of photons propagating in the vertical direction is longer than that of photons propagating in the horizontal plane of the wafer. This requires that the reflectivity at the edge of the device be minimized. Typically this is achieved by minimizing the refractive index change at the edges. Typically $R_b \approx 1$ and $R_f < 1$ to optimize output coupling. In the preferred embodiment, output reflector 12 is adjusted such that $R_f \approx 0.8$. These calculations suggest a stack comprising sixteen layers for lower reflector 19 and nine layers for output reflector 12. This asymmetric design ensures that approximately 85% of the superluminescent emission is released from the top surface while minimizing the thickness of lower reflector 19 and output reflector 12 to reduce epitaxial growth time.

An enhancement to the preferred embodiment adds oxygen implant 14 within top spacer 17. Oxygen implant 14 serves to define the emitting region, restricting or confining the flow of electric current to the interior of the device while reducing the reflectivity at the edges to nearly zero. Thus horizontal emission is suppressed in two ways, by having a very short and well defined active region in the horizontal direction and by absorbing light which is emitted horizontally in the regions defined by oxygen implant 14. Emission in the vertical direction by contrast, is enhanced by the increased photon lifetime provided by lower reflector 19 and output reflector 12. The result is a device which operates as a superluminescent light emitter in a vertical direction.

An alternative embodiment utilizes a dielectric mirror for an output reflector 12. For operation of light having wavelengths greater than approximately 1.0 micro-meters a reflectivity of 0.8 can be achieved using three layers of Si-SiNx. Yet another alternative embodiment utilizes a p type substrate so that lower reflector 19 may be heavily p doped to improve the flow of bias current through the SUPERSLED. It is anticipated that etched mesas may be used to form waveguides in a manner similar to that used for vertical cavity surface emitting lasers. Similarly the implanted layer used to suppress the undesired horizontal light emissions may also provide some form of optical waveguide.

By now it should be clear that the superluminescent surface light emitting device provided by this invention combines the advantages of superluminescence with the fabrication advantages of surface emitting devices. As a surface emitting device it is easy to build, package and test. The device may easily be fabricated as part of a large array of such devices or as part of a larger integrated circuit. As a superluminescent device it combines high efficiency with broad spectral bandwidth.

We claim:

1. A superluminescent surface light emitting device, comprising:
   a semiconductor substrate;
   a first reflector formed above a surface of said semiconductor substrate;
   at least one light emitting region, which emits light when a bias current is applied, formed in a plane above said first reflector;
   a contact means whereby said bias current may be applied to said light emitting region; and
   a second reflector located in a plane above said light emitting region and wherein said combined reflectivities of said first and second reflectors are selected such that said surface light emitting device will emit light while operating in a superluminescent mode in a vertical direction.

2. The superluminescent surface light emitting device of claim 1 wherein said combined reflectivities of said first and second reflectors, plus said output of said light emitting region are selected to provide a total cavity gain which is greater than zero, but less than a lasing threshold.

3. The superluminescent surface light emitting device of claim 1 wherein said first and second reflectors comprise a superlattice structure in which alternating layers of AlAs and AlGaAs are formed having matching crystal alignments.

4. The superluminescent surface light emitting device of claim 3 wherein said combined reflectivities of said first and second reflectors are adjusted by adding or subtracting reflective layers within their respective structures.

5. The superluminescent surface light emitting device of claim 4 wherein said first reflector comprises sixteen reflective layers and said second reflector comprises nine reflective layers.

6. The superluminescent surface light emitting device of claim 1 wherein said second reflector is comprised of a dielectric material.

7. The superluminescent surface light emitting device of claim 6 wherein said second reflector is comprised of a Si/SiO$_2$ dielectric material.

8. The superluminescent surface light emitting device of claim 1 further comprising:
a means for suppressing an undesired superluminescence which is parallel to said surface.

9. The superluminescent surface light emitting device of claim 8 further comprising:
a means whereby said reflectivities at said edges of said superluminescent region are reduced to suppress undesired superluminescence which is parallel to said surface of said semiconductor substrate.

10. The superluminescent surface light emitting device of claim 9 wherein oxygen ions are implanted at said edges of said emitting region to reduce said reflectivities at said edges of said superluminescent region and to confine said applied bias current to a predetermined region in said horizontal direction.

11. The superluminescent surface light emitting device of claim 1 wherein said semiconductor substrate is fabricated from a p type GaAs material.

12. A method for fabricating a semiconductor light emitting device for superluminescent light emission perpendicular to said surface, comprising:
providing a semiconductor substrate;
forming a first mirror above a surface of said semiconductor substrate;
forming at least one light emitting region in a plane above said first mirror, which includes at least one active layer which emits light when impressed with a bias current;
forming a second mirror above said light emitting region;
adjusting said combined reflectivities of said first and second mirrors such that said surface light emitting device operates in a superluminescent mode in a direction perpendicular to said semiconductor substrate; and
reducing said reflectivities at said edges of said superluminescent region to suppress undesired superluminescence in a direction parallel to said semiconductor substrate.

13. A superluminescent surface light emitting device, comprising,
an n type GaAs substrate;
an n type buffer layer serving to smooth a top surface of said n type GaAs substrate;
a first superlattice reflector, doped n type, formed on said top surface of said n type GaAs buffer;
at least one multiple quantum well, which emits light when a bias current is applied, formed in a plane above said first superlattice reflector;
a bottom spacer having a narrow bandgap formed between said first reflector and said multiple quantum well which serves to confine holes and electrons within said multiple quantum well;
a top spacer having a narrow bandgap on said multiple quantum well which serves to confine holes and electrons within said multiple quantum well;
a top contact and a bottom contact whereby a bias current may be applied to said light emitting region;
a second superlattice reflector, doped p type, located in a plane above said light emitting region, wherein said combined reflectivities of said first and second superlattice reflectors are selected such that said surface light emitting device operates in a superluminescent mode in a direction perpendicular to said n type GaAs substrate; and
at least one region located at said edges of said emitting region where oxygen ions are implanted to reduce said reflectivities at said edges of said superluminescent region and to confine said applied bias current to a predetermined region in said horizontal direction so as to suppress undesired superluminescence which is parallel to said n type GaAs substrate.

* * * * *